US012635565B2

(12) United States Patent
Lim et al.

(10) Patent No.: US 12,635,565 B2
(45) Date of Patent: May 19, 2026

(54) SEMICONDUCTOR PACKAGES FOR ALTERNATE STACKED MEMORY AND METHODS OF MANUFACTURING THE SAME

(71) Applicant: Intel Corporation, Santa Clara, CA (US)

(72) Inventors: Seok Ling Lim, Kedah (MY); Jenny Shio Yin Ong, Pulau Pinang (MY); Bok Eng Cheah, Pulau Pinang (MY); Jackson Chung Peng Kong, Pulau Pinang (MY); Kooi Chi Ooi, Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 128 days.

(21) Appl. No.: 17/857,062

(22) Filed: Jul. 4, 2022

(65) Prior Publication Data

US 2024/0006376 A1     Jan. 4, 2024

(51) Int. Cl.
| | |
|---|---|
| *H01L 25/065* | (2023.01) |
| *H01L 25/00* | (2006.01) |
| *H01L 25/18* | (2023.01) |

(52) U.S. Cl.
CPC .......... *H01L 25/0652* (2013.01); *H01L 25/18* (2013.01); *H01L 25/50* (2013.01); *H01L 2225/06513* (2013.01); *H01L 2225/06544* (2013.01); *H01L 2225/06548* (2013.01); *H01L 2225/06582* (2013.01)

(58) Field of Classification Search
CPC ..... H01L 25/0652; H01L 25/18; H01L 25/50; H01L 2225/06513; H01L 2225/06544
See application file for complete search history.

(56) References Cited

U.S. PATENT DOCUMENTS

| | | | | |
|---|---|---|---|---|
| 11,239,199 | B2 * | 2/2022 | Seidemann | ............. H01L 24/81 |
| 11,856,800 | B2 * | 12/2023 | Yu | ........................ H01L 25/0652 |
| 2017/0194266 | A1 * | 7/2017 | Kwon | ...................... H01L 24/73 |
| 2021/0202463 | A1 * | 7/2021 | Chen | ....................... H01L 24/24 |
| 2024/0063087 | A1 * | 2/2024 | Kuo | ....................... H01L 23/42 |
| 2024/0332256 | A1 * | 10/2024 | Lin | .......................... H01L 24/17 |
| 2024/0339411 | A1 * | 10/2024 | Wu | ..................... H01L 23/5384 |
| 2024/0355748 | A1 * | 10/2024 | Yoo | ........................ H01L 24/81 |
| 2025/0096098 | A1 * | 3/2025 | Yim | ................... H01L 23/5389 |
| 2025/0112137 | A1 * | 4/2025 | Liu | .................. H01L 23/49822 |

(Continued)

*Primary Examiner* — Thao P Le
(74) *Attorney, Agent, or Firm* — Viering, Jentschura & Partner mbB

(57) ABSTRACT

A semiconductor package includes a silicon die including a first die surface coupled to a package substrate, a second die surface opposite to the first die surface, and at least one die sidewall orthogonal to the first die surface and the second die surface, and a mold layer including a first mold surface, a second mold surface opposite to the first mold surface, and at least one mold sidewall orthogonal to the first mold surface and the second mold surface, the at least one mold sidewall being disposed along the at least one die sidewall, and the mold layer further including a power conductive corridor extending from the first mold surface and coupled to the package substrate through the first mold surface. The semiconductor package further includes a first stacked device coupled to the first die surface and to the power conductive corridor through the first mold surface.

16 Claims, 9 Drawing Sheets

(56)     References Cited

U.S. PATENT DOCUMENTS

2025/0158004 A1*   5/2025   Yu ........................... H01L 25/18
2025/0192019 A1*   6/2025   Kim .................. H01L 23/49838
2025/0349728 A1*  11/2025   Hsu .................... H01L 21/4857

* cited by examiner

412

110

102

140    114    116    102

106    104    128

500

505 — Form silicon die on carrier

510 — Form first mold layer on carrier at periphery of silicon die

515 — Form first mold openings in first mold layer

520 — Form conductive layer on first mold layer and in first mold openings

525 — Form conductive planes on first mold layer

530 — Form mold layer by depositing second mold layer on first mold layer

A

500

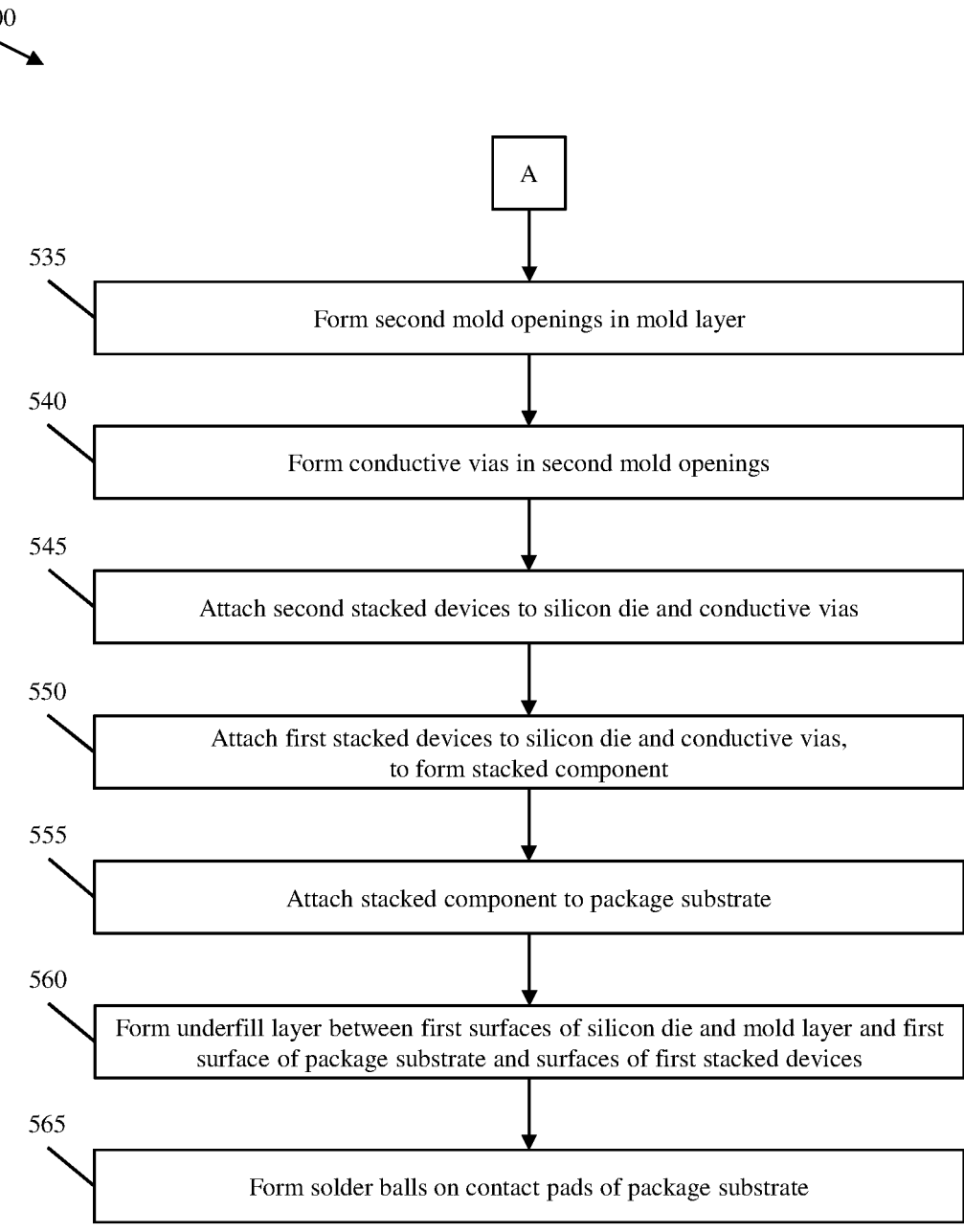

A

535 Form second mold openings in mold layer

540 Form conductive vias in second mold openings

545 Attach second stacked devices to silicon die and conductive vias

550 Attach first stacked devices to silicon die and conductive vias, to form stacked component 555 Attach stacked component to package substrate 560 Form underfill layer between first surfaces of silicon die and mold layer and first surface of package substrate and surfaces of first stacked devices 565 Form solder balls on contact pads of package substrate

FIG. 5B

SEMICONDUCTOR PACKAGES FOR ALTERNATE STACKED MEMORY AND METHODS OF MANUFACTURING THE SAME

BACKGROUND

In semiconductor manufacturing, there may be challenges in device form-factor, e.g., package real-estate expansion due to on-package dynamic random access memory (DRAM) devices scaling (e.g., ×4 or ×8) for improved computing performance. That is, in an example memory-on-package architecture with ×2 DRAM devices mounted lateral to a central processing unit (CPU), a system-on-chip (SOC) and/or a graphic processing unit (GPU) within a package substrate, further scaling of laterally attached on-package memory devices may inhibit device miniaturization.

Moreover, in semiconductor manufacturing, there may be challenges with signal integrity impairments, specifically, electrical coupling noises, e.g., far-end crosstalk (FEXT) induced by tightly coupled transmission lines between the CPU, the SOC and/or the GPU and the DRAM devices on the package substrate. Silicon circuitry features (e.g., equalization and/or crosstalk cancellation) may be implemented, but they may be power-consuming. There may further be computing performance degradation ascribed to signal latency contributed by lateral package interconnects.

Current solutions to cope with increased memory devices and/or bandwidth density may include package and/or board real-estate expansion to house additional DRAM devices for performance scaling. Alternatively, DRAM device form-factor miniaturization (e.g., DRAM silicon and/or package footprint reduction) may further be pursued to mitigate device form-factor expansion and/or signal integrity deterioration. Disadvantages of these current solutions may include package and/or printed circuit board form-factor expansion, which may lead to bulky devices, increased device reliability risks, package warpage control challenges and/or an increased package substrate footprint.

BRIEF DESCRIPTION OF THE DRAWINGS

In the drawings, like reference characters generally refer to the same parts throughout the different views. The drawings are not necessarily to scale, emphasis instead generally being placed upon illustrating the present disclosure. The dimensions of the various features or elements may be arbitrarily principles expanded or reduced for clarity. In the following description, various aspects of the present disclosure are described with reference to the following drawings, in which:

FIGS. 5A and 5B are flow diagrams of the method of FIGS. 4A-4K; and

DETAILED DESCRIPTION

Figures 1A, 1B:
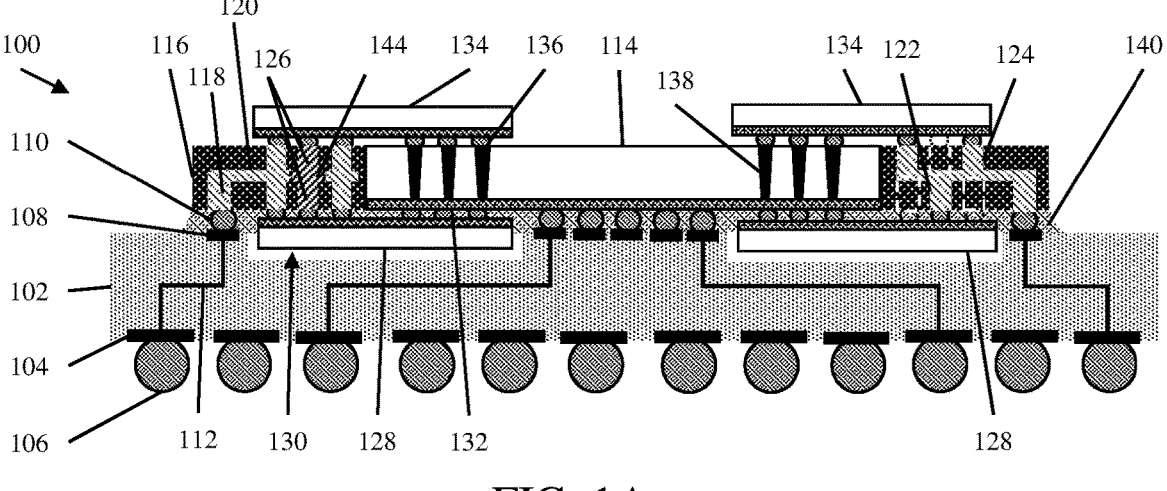
FIG. 1A is a cross-sectional view of a semiconductor package for alternate stacked memory, according to aspects of the present disclosure.
FIG. 1B is a top view of the semiconductor package of FIG. 1A.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure relates to semiconductor packages for alternate stacked memory and methods of manufacturing the same.

A present semiconductor package includes a silicon die including a first die surface coupled to a package substrate, a second die surface opposite to the first die surface, and at least one die sidewall orthogonal to the first die surface and the second die surface, and a mold layer including a first mold surface, a second mold surface opposite to the first mold surface, and at least one mold sidewall orthogonal to the first mold surface and the second mold surface, the at least one mold sidewall being disposed along the at least one die sidewall, and the mold layer further including a power conductive corridor extending from the first mold surface and coupled to the package substrate through the first mold surface. The semiconductor package further includes a first stacked device coupled to the first die surface and to the power conductive corridor through the first mold surface, and a second stacked device coupled to the second die surface and to the power conductive corridor through the second mold surface.

In another aspect, a method of manufacturing a semiconductor package pursuant to the present disclosure includes forming a silicon die on a carrier, forming a first mold layer on the carrier at a periphery of the silicon die, forming one or more first mold openings in the first mold layer, forming a conductive layer on the first mold layer and in the one or more first mold openings, and forming one or more conductive corridors in the first mold layer, and one or more conductive planes on the first mold layer by removing one or more portions of the conductive layer. The method further includes forming a final mold layer by depositing a second mold layer on the first mold layer and the one or more conductive planes, forming one or more second mold openings in the final mold layer, forming one or more conductive vias in the one or more second mold openings, and attaching one or more first stacked devices and one or more second stacked devices respectively to opposite surfaces of the silicon die and the one or more conductive vias.

In yet another aspect, a present computing device includes a semiconductor package including a silicon die including a first die surface coupled to a package substrate, a second die surface opposite to the first die surface, and at least one die sidewall orthogonal to the first die surface and the second die surface, and a mold layer including a first mold surface, a second mold surface opposite to the first mold surface, and at least one mold sidewall orthogonal to the first mold surface and the second mold surface, the at least one mold sidewall being disposed along the at least one die sidewall, and the mold layer further including a power conductive corridor extending from the first mold surface and coupled to the package substrate through the first mold surface. The semiconductor package further includes a first stacked device coupled to the first die surface and to the power conductive corridor through the first mold surface, and a second stacked device coupled to the second die surface and to the power conductive corridor through the second mold surface.

Advantageously, the above aspects may allow for device miniaturization through alternate device stacking architecture that allows 2× memory device (e.g., memory package) density scaling with minimum package real-estate trade-off. The above aspects may further allow for enhanced electrical performance, e.g., reduced signal latency between a CPU, a GPU or a SOC (e.g., a processor) and DRAM devices through shorter and less distorted signal transmission paths, namely, direct signal interconnects between the processor and the multiple memory devices attached thereon. The reduced signal latency may further be achieved through shorter power delivery AC loop inductance and/or reduced DC resistance for the memory devices through conductive corridors arranged at a periphery of the processor.

FIG. 1A is a cross-sectional view of a semiconductor package 100 for alternate stacked memory packaging, according to aspects of the present disclosure. FIG. 1B is a top view of the semiconductor package 100 of FIG. 1A.

In detail, FIG. 1A is a cross-sectional view of the semiconductor package 100 along a line A-A' shown in FIG. 1B. Referring to FIGS. 1A and 1B, the semiconductor package 100 includes a package substrate 102 including a first surface on which contact pads 104 are disposed. Solder balls 106 are respectively disposed on the contact pads 104. The package substrate 102 further includes a second surface on which contact pads 108 are disposed. Solder bumps 110 are respectively disposed on the contact pads 108. Wires 112 connect a portion of the of the solder bumps 110 to a portion of the solder balls 106.

The semiconductor package 100 further includes a silicon die 114 disposed on a center portion of the solder bumps 110 for the package substrate 102. The silicon die 114 may include a CPU, a GPU, a SOC, a field programmable gate array (FPGA) and/or a platform controller hub (PCH) chipset. A peripheral sidewall of the silicon die 114 may have a thickness ranging from 200 μm to 700 μm.

Moreover, the semiconductor package 100 includes a mold layer 116 disposed on end portions of the solder bumps 110 for the package substrate 102. The mold layer 116 may include epoxy polymer and silica particle composites. In an embodiment, the mold layer 116 may include a silicone layer or a polyimide layer. A peripheral sidewall of the mold layer 116 may have a thickness ranging from 200 μm to 700 μm, which may be equivalent to the thickness of the peripheral sidewall of the silicon die 114.

The mold layer 116 includes power conductive corridors 118 respectively extending from the end portions of the solder bumps 110 and from a first surface of the mold layer 116. The mold layer 116 further includes power conductive planes 120 respectively extending from the power conductive corridors 118 and interposed between the first surface of the mold layer 116 and a second surface of the mold layer 116 that is opposite to the first surface. The power conductive planes 120 extend orthogonal to the power conductive corridors 118 and in parallel to the first and second surfaces of the mold layer 116.

Moreover, the mold layer 116 includes first power conductive vias 122 disposed through the first surface of the mold layer 116, and second power conductive vias 124 disposed through the second surface of the mold layer 116. In an embodiment, the first power conductive vias 122 and the second power conductive vias 124 may be integral structures, e.g., as shown in a left side of FIG. 1A. In another embodiment, the first power conductive vias 122 may be horizontally offset from the second power conductive vias 124, e.g., as shown in a right side of FIG. 1A.

In embodiments, the power conductive corridors 118, the power conductive planes 120, the first power conductive vias 122 and the second power conductive vias 124 may include electrically conductive materials, e.g., copper or tin-silver solder composites. The power conductive corridors 118, the power conductive planes 120, the first power conductive vias 122 and the second power conductive vias 124 may further be electrically connected to a power supply voltage ($V_{cc}$) of e.g., 0.3 V, 0.5 V or 0.8 V.

Moreover, the mold layer 116 includes ground conductive corridors 142 respectively extending from the end portions of the solder bumps 110 and from the first surface of the mold layer 116. The mold layer 116 further includes ground conductive planes 144 respectively extending from the ground conductive corridors 142 and interposed between the first and second surfaces of the mold layer 116. The ground conductive planes 144 extend orthogonal to the ground conductive corridors 142 and in parallel to the first and second surfaces of the mold layer 116. The mold layer 116 further includes ground conductive vias 126 disposed through the first and second surfaces of the mold layer 116.

In embodiments, the ground conductive corridors 142, the ground conductive planes 144 and the ground conductive vias 126 may include electrically conductive materials, e.g., copper or tin-silver solder composites. The ground conductive corridors 142, the ground conductive planes 144 and the ground conductive vias 126 may further be electrically connected to a ground reference voltage ($V_{ss}$).

Moreover, the semiconductor package 100 includes first stacked devices 128, each of which may include, e.g., a memory device, a radio frequency integrated circuit (RFIC), a deep learning processor (DLP) or a neural network processor. The first stacked devices 128 are partially or entirely disposed in recesses 130 disposed through the first surface of the package substrate 102 and into the package substrate 102. The first stacked devices 128 are coupled to a first surface of the silicon die 114 via a first portion of solder bumps 132 for communicating signals, and are respectively coupled to the first power conductive vias 122 and the ground conductive vias 126 through a second portion of the solder bumps 132 for receiving power.

The semiconductor package 100 further includes second stacked devices 134, each of which may include, e.g., a memory device, an RFIC, a DLP or a neural network processor. The second stacked devices 134 are coupled to a second surface of the silicon die 114 that is opposite to the first surface of the silicon die 114, via a first portion of solder bumps 136 for communicating signals, and are respectively coupled to the second power conductive vias 124 and the ground conductive vias 126 through a second portion of the solder bumps 136 for receiving power. The silicon die 114 includes through silicon vias (TSVs) 138 connecting the first portion of the solder bumps 136 to the first surface of the silicon die 114 and/or the first portion of the solder bumps 132.

Further, the semiconductor package 100 includes an underfill layer 140 interposed between the first surfaces of the silicon die 114 and the mold layer 116 and the first surface of the package substrate 102 and surfaces of the first stacked devices 128. The underfill layer 140 may include epoxy polymer and silica particle composites. In an embodiment, the underfill layer 140 may at least partially extend within the recesses 130.

Referring to FIG. 1B, the second stacked devices 134 are shown to be transparent (e.g., with dashed lines) to clearly show elements underneath the second stacked devices 134, such as, for example, the solder bumps 136.

The power conductive planes 120 and the ground conductive planes 144 on a right side of FIG. 1B may be lesser in area than those on a left side of FIG. 1B, to facilitate different power integrity design requirements and/or form-factor optimization.

The mold layer 116 further includes additional conductive corridors 146 respectively extending from the end portions of the solder bumps 110 and from the first surface of the mold layer 116. The mold layer 116 further includes additional conductive planes 148 respectively extending from the additional conductive corridors 146 and interposed between the first and second surfaces of the mold layer 116. The additional conductive planes 148 extend orthogonal to the additional conductive corridors 146 and in parallel to the first and second surfaces of the mold layer 116. The mold layer 116 further includes additional conductive vias (not shown) disposed through the first and second surfaces of the mold layer 116.

In embodiments, the additional conductive corridors 146, the additional conductive planes 148 and the additional conductive vias may include electrically conductive materials, e.g., copper or tin-silver solder composites. The additional conductive corridors 146, the additional conductive planes 148 and the additional conductive vias may further be electrically connected to an additional power supply voltage of e.g., 0.3 V, 0.5 V or 0.8 V, which is different than the power supply voltage connected to the power conductive corridors 118, the power conductive planes 120, the first power conductive vias 122 and the second power conductive vias 124.

Advantageously, by stacking the second stacked devices 134 on top of the first stacked devices 128, the semiconductor package 100 may allow for device miniaturization, increased density scaling of the first and second stacked devices 128 and 134 and minimum real-estate trade-off of the package substrate 102. Further, the solder bumps 132 and 136 and the TSVs 138 may respectively serve as direct signal interconnects between the silicon die 114 and the first and second stacked devices 128 and 134, which may reduce lengths of communication routes and thus communication signal latency between these elements. Moreover, the semiconductor package 100 may allow for shorter power delivery for the first and second stacked devices 128 and 134 through the power conductive corridors 118, the ground conductive corridors 142 and the additional conductive corridors 146.

Figure 2A:
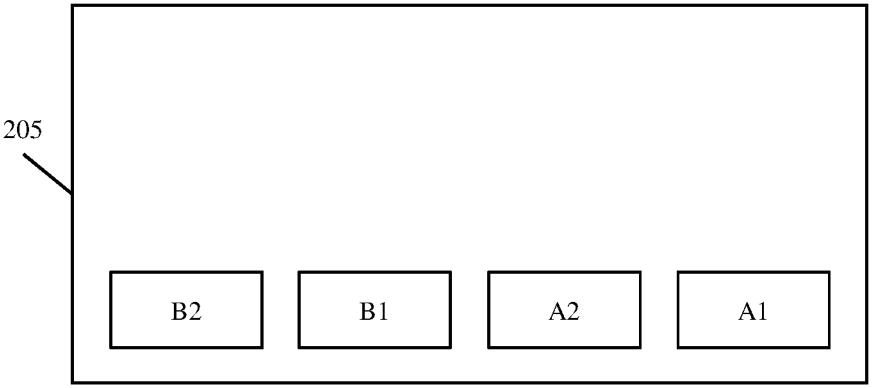
FIG. 2A is a block diagram of a serial configuration of two sets of memory circuitry blocks in a silicon die.
Figure 2B:
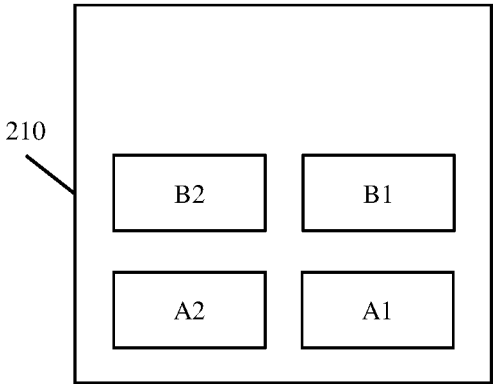
FIG. 2B is a block diagram of a parallel configuration of two sets of memory circuitry blocks in a silicon die, according to aspects of the present disclosure.

FIG. 2A is a block diagram of a serial configuration 205 of two sets of memory circuitry blocks (A1, A2) and (B1, B2) in a silicon die. FIG. 2B is a block diagram of a parallel configuration 210 of two sets of memory circuitry blocks (A1, A2) and (B1, B2) in a silicon die, according to aspects of the present disclosure.

Silicon area reduction (e.g., of the silicon die 114 of FIGS. 1A and 1B) may be attainable through a reduced shoreline (e.g., an x-axis) by using the parallel configuration 210 (a parallel circuitry floorplan) shown in FIG. 2B, in which the two sets of memory circuitry blocks (A1, A2) and (B1, B2) extend along the shoreline and another axis (e.g., a y-axis). The shoreline is reduced compared to a shoreline (e.g., an x-axis) of the conventional serial configuration 205 (a serial circuitry floorplan) shown in FIG. 2A, in which the two sets of memory circuitry blocks (A1, A2) and (B1, B2) extend along only the shoreline. The parallel configuration 210 is allowed in the semiconductor package 100 of FIGS. 1A and 1B due to the stacking of the first and second stacked devices 128 and 134.

Figure 3A:
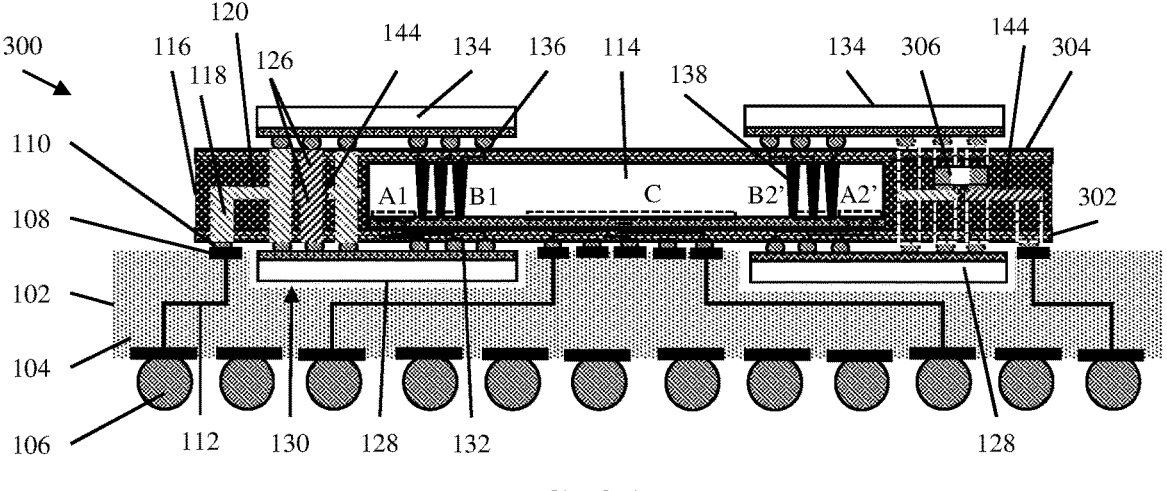
FIG. 3A is a cross-sectional view of a semiconductor package for alternate stacked memory, according to other aspects of the present disclosure.
Figure 3B:
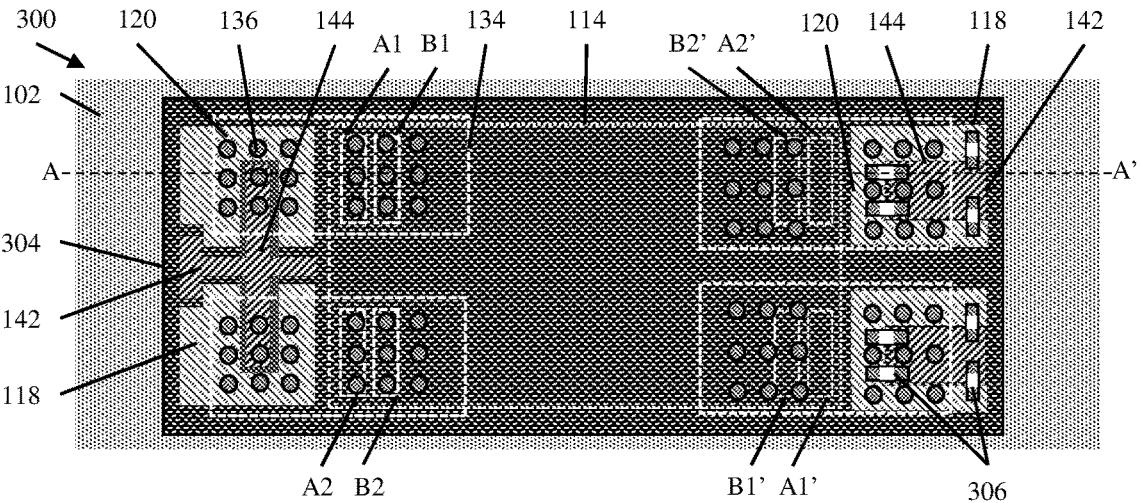
FIG. 3B is a top view of the semiconductor package of FIG. 3A.

FIG. 3A is a cross-sectional view of a semiconductor package 300 for alternate stacked memory packaging, according to other aspects of the present disclosure. FIG. 3B is a top view of the semiconductor package 300 of FIG. 3A.

In detail, FIG. 3A is a cross-sectional view of the semiconductor package 300 along a line A-A' shown in FIG. 3B. Referring to FIGS. 3A and 3B, the semiconductor package 300 includes all of elements of the semiconductor package 100 of FIGS. 1A and 1B.

The semiconductor package 300 further includes a first redistribution layer (RDL) 302 interposed between the first stacked devices 128 and the first surfaces of the silicon die 114 and the mold layer 116, and a second RDL 304 interposed between the second stacked devices 134 and the second surfaces of the silicon die 114 and the mold layer 116. The first RDL 302 and the second RDL 304 facilitate integration of the silicon die 114 with the first and second stacked devices 128 and 134 including larger interconnects, e.g., larger solder ball grid array (BGA) pitch geometry. In detail, first circuit blocks A1, A2, A1' and A2' of the silicon die 114 are respectively disposed adjacent edges of the silicon die 114 and coupled to the first stacked devices 128 through metal routing of the first RDL 302. Second circuit blocks B1, B2, B1' and B2' of the silicon die 114 are respectively disposed adjacent a center (core) of the silicon die 114 and coupled to the second stacked devices 134 through the TSVs 138 and metal routing of the second RDL 304. A center circuit block C of the silicon die 114 is disposed around the center of the silicon die 114 and coupled to package substrate 102 through metal routing of the first RDL 302.

Moreover, the semiconductor package 300 includes a passive component 306 coupling the power conductive corridors 118 to the ground conductive corridors 142 and coupling the power conductive planes 120 to the ground conductive planes 144. The passive component 306 may include, e.g., a capacitor, a voltage regulator or an inductor to improve power delivery through shorter AC loop inductance and/or reduced DC resistance between the first and second stacked devices 128 and 134 and a decoupling capacitor.

Referring to FIG. 3B, the second stacked devices 134 are shown to be transparent (e.g., with dashed lines) to clearly show elements underneath the second stacked devices 134, such as, for example, the solder bumps 136. The silicon die 114 is further shown to be transparent (e.g., with dashed lines) because it is covered by the second RDL 304.

FIGS. 4A, 4B, 4C, 4D, 4E, 4F, 4G, 4H, 4I, 4J and 4K are cross-sectional views illustrating a method 500 of manufacturing the semiconductor package 100 of FIG. 1A, according to aspects of the present disclosure. FIGS. 5A and 5B are flow diagrams of the method 500 of FIGS. 4A-4K.

Figures 4A, 4B, 4C, 4D, 4E:
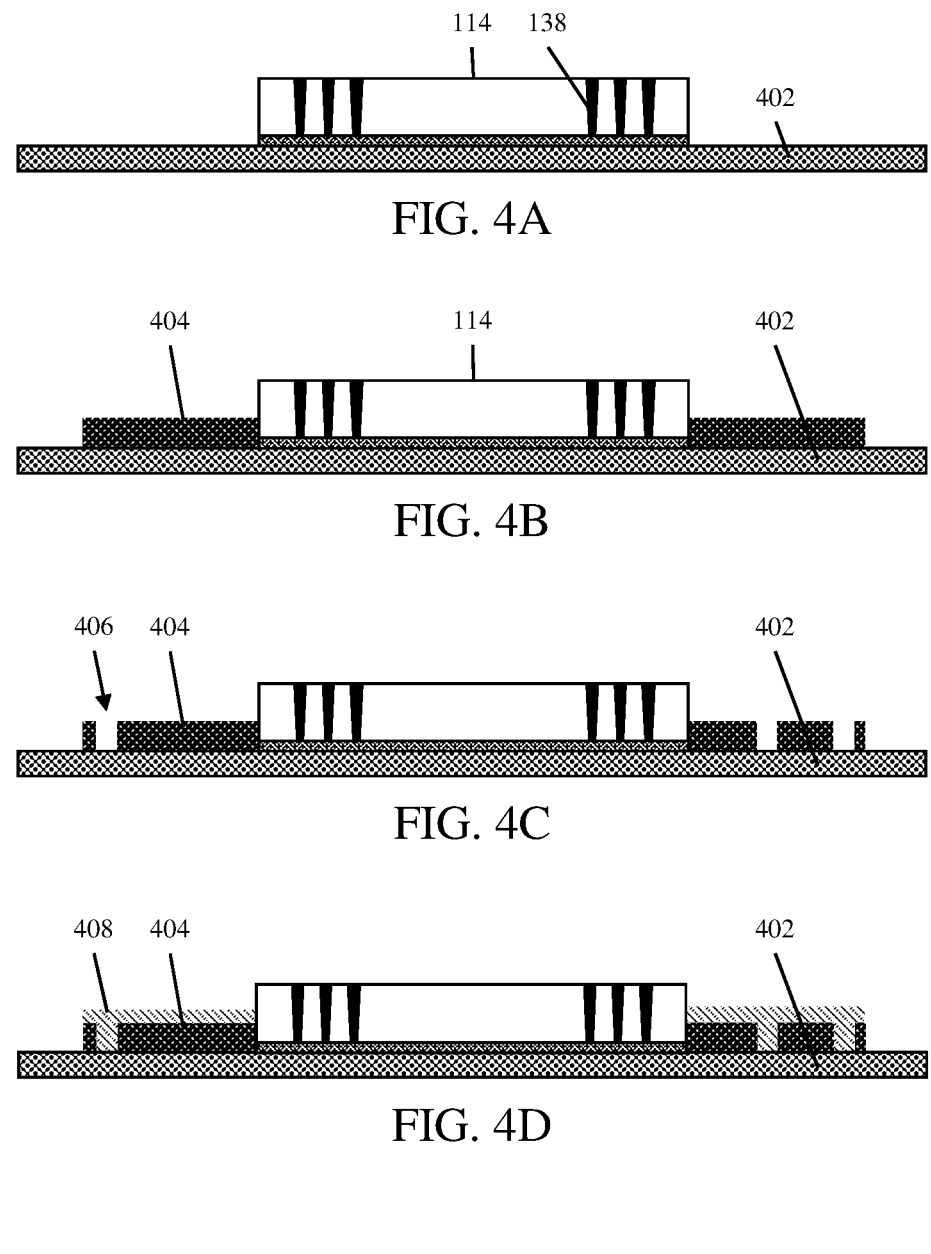
FIGS. 4A, 4B, 4C, 4D, 4E, 4F, 4G, 4H, 4I, 4J and 4K are cross-sectional views illustrating a method of manufacturing the semiconductor package of FIG. 1A, according to aspects of the present disclosure.
Figure 5A:
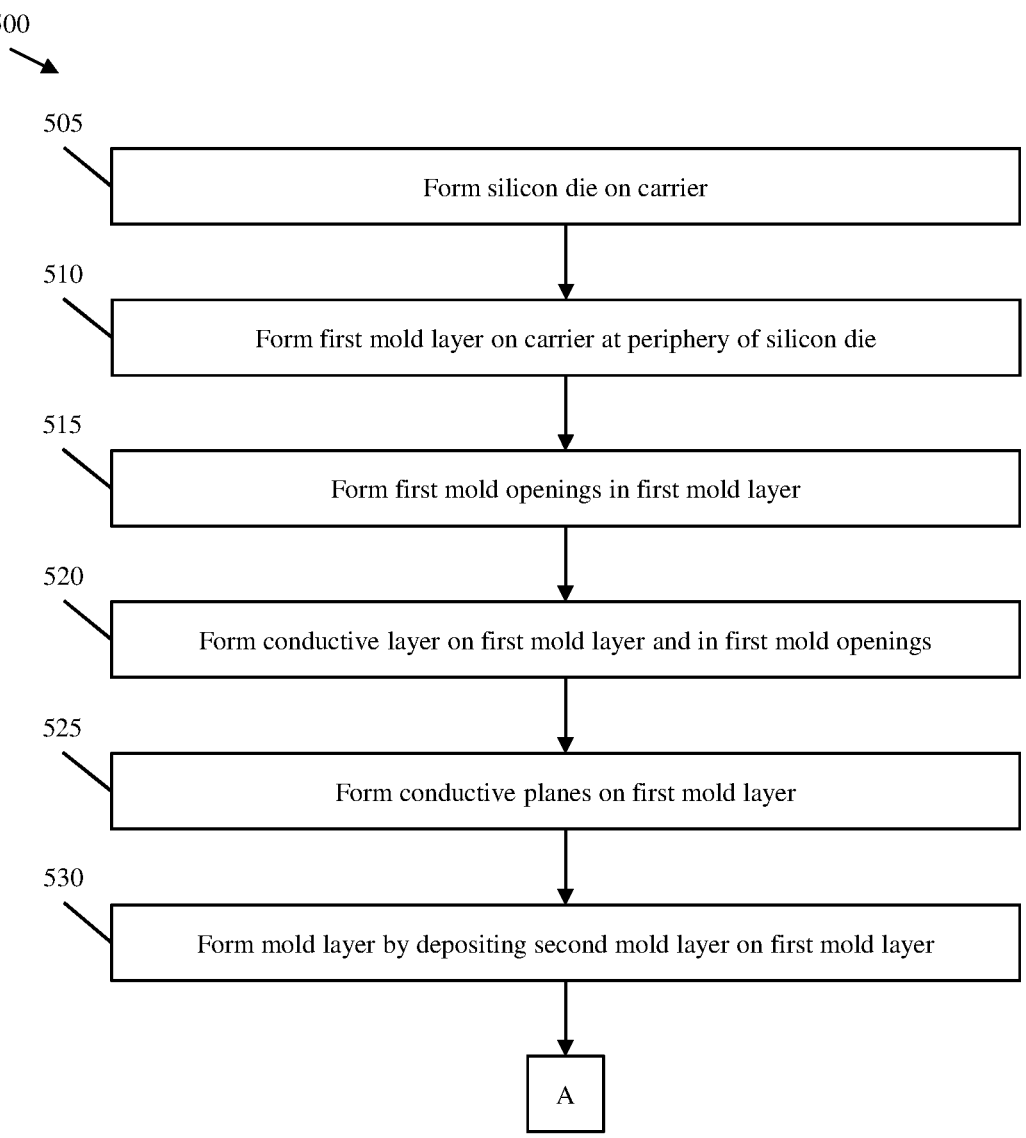

Referring to FIGS. 4A and 5A, in operation 505, the method 500 includes forming the silicon die 114 including the TSVs 138, on a carrier 402. The silicon die 114 may be attached to the carrier 402 via a lamination and hot press process.

Referring to FIGS. 4B and 5A, in operation 510, the method 500 includes forming a first mold layer 404 on the carrier 402 at a periphery of the silicon die 114. The first mold layer 404 may be deposited on the carrier 402 via a transfer, injection and compress molding process.

Referring to FIGS. 4C and 5A, in operation 515, the method 500 includes forming first mold openings 406 (e.g., trenches or holes) in the first mold layer 404. These portions of the first mold layer 404 may be removed via a laser drill or etch process or a chemical etch process. The first mold openings 406 may be formed in the first mold layer 404 to be above a surface of the carrier 402 and/or through the first mold layer 404 to the surface of the carrier 402.

Referring to FIGS. 4D and 5A, in operation 520, the method 500 includes forming a conductive layer 408 on the first mold layer 404 and in the first mold openings 406. The conductive layer 408 may be deposited on the first mold layer 404 and in the first mold openings 406 via electroplating or a solder paste printing process. The conductive layer 408 may be formed in the first mold layer 404 to be above the surface of the carrier 402 and/or through the first mold layer 404 to contact the surface of the carrier 402.

Referring to FIGS. 4E and 5A, in operation 525, the method 500 includes forming the power conductive corridors 118 in the first mold layer 404, and the power conductive planes 120 and the ground conductive planes 144 on the first mold layer 404. The power conductive corridors 118, the power conductive planes 120 and the ground conductive planes 144 may be formed by removing portions of the conductive layer 408 via a chemical etch process.

Referring to FIGS. 4E and 5A, in operation 530, the method 500 includes forming the mold layer 116 (a final mold layer) by depositing a second mold layer on the first mold layer 404, the power conductive planes 120 and the ground conductive planes 144. The second mold layer may be deposited on the first mold layer 404, the power conductive planes 120 and the ground conductive planes 144 via a transfer, injection and compress molding process.

Figure 4F:

Referring to FIGS. 4F and 5B, in operation 535, the method 500 includes forming second mold openings 410 (e.g., trenches or holes) in the mold layer 116. These portions of the mold layer 116 may be removed via a mechanical drill process, a laser drill or etch process or a chemical etch process. The second mold openings 410 may be formed in the mold layer 116 to be above the power conductive planes 120 (and/or the ground conductive planes 144), in the mold layer 116 and through the power conductive planes 120 (and/or the ground conductive planes 144) to be above the surface of the carrier 402, and/or through the mold layer 116 and the power conductive planes 120 (and/or the ground conductive planes 144) to the surface of the carrier 402.

Figure 4G:
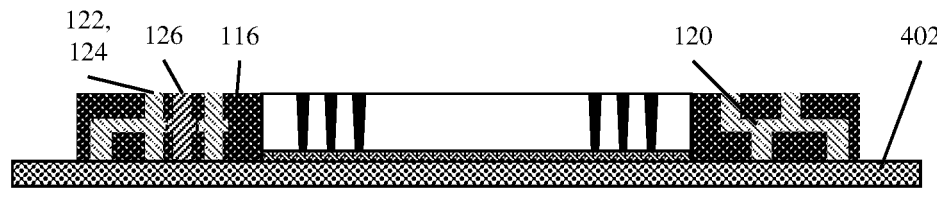

Referring to FIGS. 4G and 5B, in operation 540, the method 500 includes forming the first and second power conductive vias 122 and 124 and the ground conductive vias 126 in the second mold openings 410. The first and second power conductive vias 122 and 124 and the ground conductive vias 126 may be deposited in the second mold openings 410 via electroplating or a paste printing and planar grinding process. The first and second power conductive vias 122 and 124 and the ground conductive vias 126 may formed in the mold layer 116 to be above the power conductive planes 120 (and/or the ground conductive planes 144), in the mold layer 116 and through the power conductive planes 120 (and/or the ground conductive planes 144) to be above the surface of the carrier 402, and/or through the mold layer 116 and the power conductive planes 120 (and/or the ground conductive planes 144) to the surface of the carrier 402.

Figure 4H:
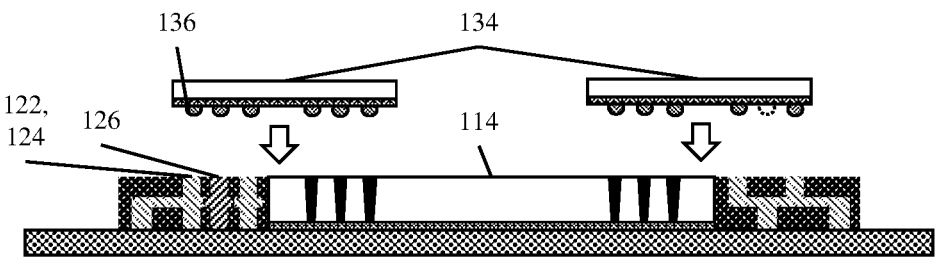

Referring to FIGS. 4H and 5B, in operation 545, the method 500 includes attaching the second stacked devices 134 to the second surface of the silicon die 114 and the second power conductive vias 124 and the ground conductive vias 126. The second stacked devices 134 may be attached via a thermal compression bonding and reflow process involving the solder bumps 136.

Figure 4I:
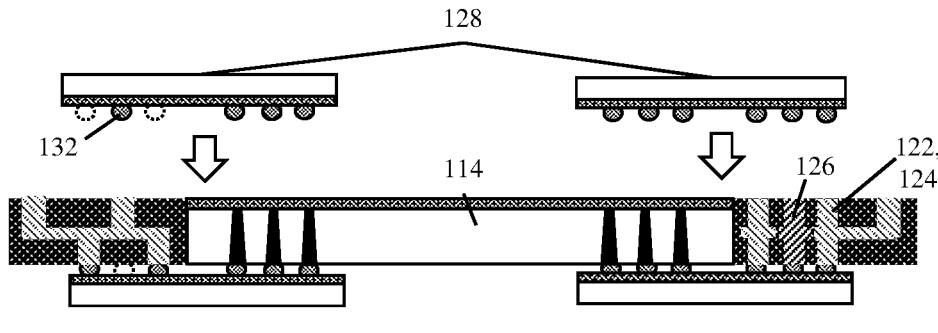

Referring to FIGS. 4I and 5B, in operation 550, the method 500 includes attaching the first stacked devices 128 to the first surface of the silicon die 114 and the first power conductive vias 122 and the ground conductive vias 126, to form a stacked component 412. The first stacked devices 128 may be attached via a thermal compression bonding and reflow process involving the solder bumps 132.

Figure 4J:
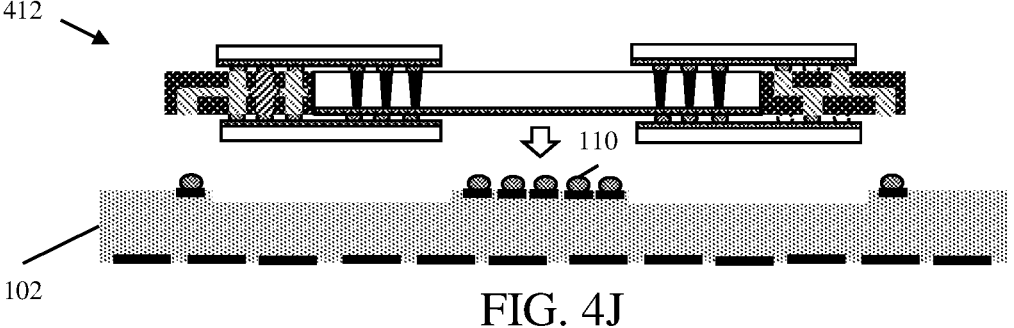

Referring to FIGS. 4J and 5B, in operation 555, the method 500 includes attaching the stacked component 412 to the package substrate 102. The stacked component 412 may be attached to the package substrate 102 via a thermal compression bonding and reflow process involving the solder bumps 110.

Figure 4K:
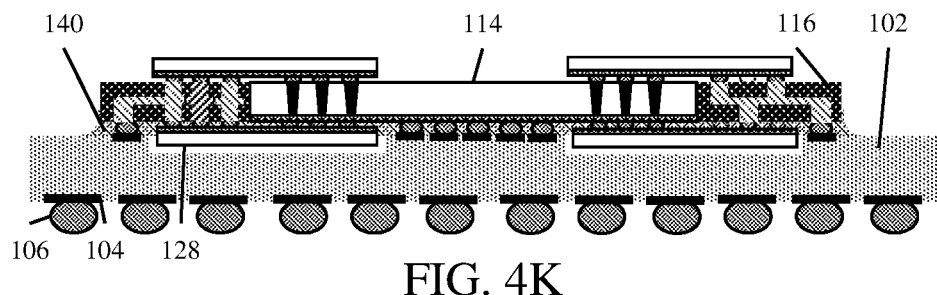

Referring to FIGS. 4K and 5B, in operation 560, the method 500 includes forming the underfill layer 140 between the first surfaces of the silicon die 114 and the mold layer 116 and the first surface of the package substrate 102 and the surfaces of the first stacked devices 128. The underfill layer 140 may be formed via a capillary dispense and curing process.

Referring to FIGS. 4K and 5B, in operation 565, the method 500 includes forming the solder balls 106 on the contact pads 104 of the package substrate 102. The solder balls 106 may be formed via a surface mounting and reflow process.

The methods and sequence of steps presented above are intended to be examples for manufacturing the semiconductor package, according to aspects of the present disclosure. It will be apparent to those ordinary skilled practitioners that the foregoing process operations may be modified without departing from the spirit of the present disclosure.

Figure 6:
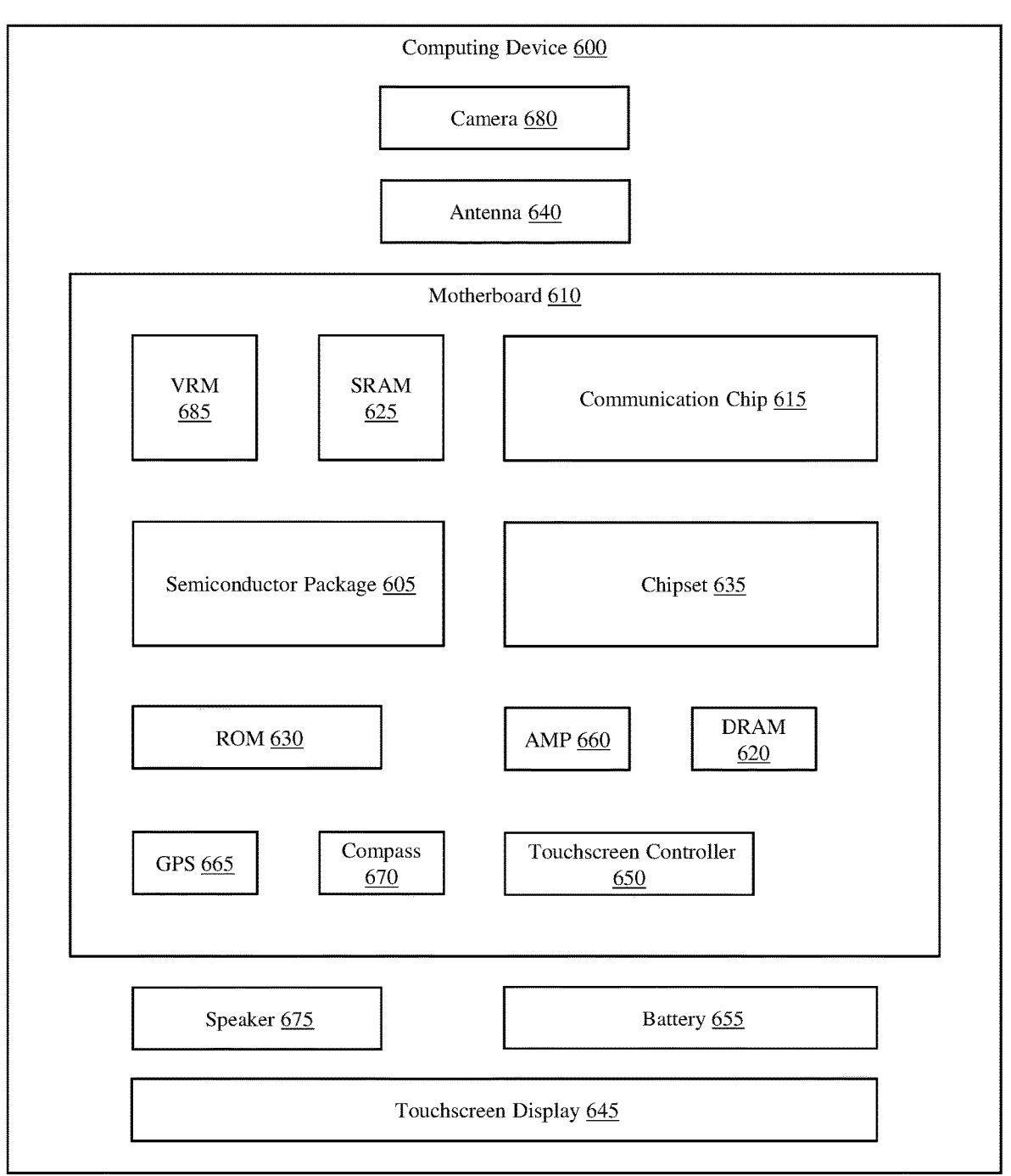
FIG. 6 is a block diagram of a computing device including a semiconductor package for alternate stacked memory, according to aspects of the present disclosure.

FIG. 6 is a block diagram of a computing device 600 including a semiconductor package 605 for alternate stacked memory, according to aspects of the present disclosure.

Referring to FIG. 6, the computing device 600 may house a board such as a motherboard 610. The semiconductor package 605, according to the aspects of the present disclosure, may be incorporated as part of the motherboard 610. The motherboard 610 may further include a number of components, including, but not limited to, at least one communication chip 615. In some implementations, the at least one communication chip 615 may also be physically and electrically coupled to the motherboard 610. In further implementations, the communication chip 615 may be part of the semiconductor package 605.

Depending on its applications, the computing device 600 may include other components that may or may not be physically and electrically coupled to the motherboard 610. These other components may include, but are not limited to, volatile memory (e.g., DRAM 620 and SRAM 625), non-volatile memory (e.g., ROM 630), flash memory, a graphics processor, a digital signal processor, a crypto processor, a chipset 635, an antenna 640, a display, a touchscreen display 645, a touchscreen controller 650, a battery 655, an audio codec, a video codec, a power amplifier (AMP) 660, a global positioning system (GPS) device 665, a compass 670, a Geiger counter, an accelerometer, a gyroscope, a speaker 675, a camera 680, a voltage regulator module (VRM) 685 and a mass storage device (such as hard disk drive, compact disk (CD), digital versatile disk (DVD), and so forth).

The communication chip 615 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 615 may implement any of a number of wireless standards or protocols, including but not limited to Institute for Electrical and Electronics Engineers (IEEE) standards including Wi-Fi (IEEE 1002.11 family), IEEE 1002.16 standards (e.g., IEEE 1002.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 1002.16 compatible BWA networks are generally referred to as WiMAX networks, an acronym that stands for Worldwide Interoperability for Microwave Access, which is a certification mark for products that pass conformity and interoperability tests for the IEEE 1002.16 standards.

The communication chip 615 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 615 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 615 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 615 may operate in accordance with other wireless protocols in other aspects.

The computing device 600 may include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 600 may be a mobile computing device. In further implementations, the computing device 600 may be any other electronic device that processes data.

To more readily understand and put into practical effect the present semiconductor packages and methods, particular aspects will now be described by way of examples. For the sake of brevity, duplicate descriptions of features and properties may be omitted.

Examples

Example 1 provides a semiconductor package including a silicon die including a first die surface coupled to a package substrate, a second die surface opposite to the first die surface, and at least one die sidewall orthogonal to the first die surface and the second die surface, and a mold layer including a first mold surface, a second mold surface opposite to the first mold surface, and at least one mold sidewall orthogonal to the first mold surface and the second mold surface, the at least one mold sidewall being disposed along the at least one die sidewall, and the mold layer further including a power conductive corridor extending from the first mold surface and coupled to the package substrate through the first mold surface. The semiconductor package further includes a first stacked device coupled to the first die surface and to the power conductive corridor through the first mold surface, and a second stacked device coupled to the second die surface and to the power conductive corridor through the second mold surface.

Example 2 may include the semiconductor package of example 1 and/or any other example disclosed herein, for which the mold layer may further include a power conductive plane extending from the power conductive corridor in parallel to the first mold surface and the second mold surface.

Example 3 may include the semiconductor package of example 2 and/or any other example disclosed herein, for which the mold layer may further include a first power conductive via extending from the power conductive plane through the first mold surface, and coupled to the first stacked device, and a second power conductive via extending from the power conductive plane through the second mold surface, and coupled to the second stacked device.

Example 4 may include the semiconductor package of example 3 and/or any other example disclosed herein, for which the second power conductive via may be integrally formed with the first power conductive via.

Example 5 may include the semiconductor package of example 3 and/or any other example disclosed herein, for which the second power conductive via may be horizontally offset from the first power conductive via.

Example 6 may include the semiconductor package of example 3 and/or any other example disclosed herein, for which the power conductive corridor, the power conductive plane, the first power conductive via and the second power conductive via may be connected to a power supply voltage.

Example 7 may include the semiconductor package of example 3 and/or any other example disclosed herein, for which the mold layer may further include a ground conductive corridor extending from the first mold surface and coupled to the package substrate through the first mold surface, a ground conductive plane extending from the ground conductive corridor in parallel to the first mold surface and the second mold surface, and a ground conductive via extending from the ground conductive plane through the first mold surface and the second mold surface, and coupled to the first stacked device and the second stacked device. The ground conductive corridor, the ground conductive plane and the ground conductive via may be connected to a ground reference voltage.

Example 8 may include the semiconductor package of example 7 and/or any other example disclosed herein, for which the ground conductive plane may be disposed adjacent the power conductive plane.

Example 9 may include the semiconductor package of example 8 and/or any other example disclosed herein, for which the ground conductive plane may be coupled to the power conductive plane through one or more passive components.

Example 10 may include the semiconductor package of example 9 and/or any other example disclosed herein, for which each of the one or more passive components may be one among a capacitor, a voltage regulator and an inductor.

Example 11 may include the semiconductor package of example 3 and/or any other example disclosed herein, further including a first redistribution layer disposed on the first die surface and the first mold surface. and a second redistribution layer disposed on the second die surface and the second mold surface. The first stacked device may be coupled to the silicon die and the first power conductive via through the first redistribution layer, and the second stacked device may be coupled to the silicon die and the second power conductive via through the second redistribution layer.

Example 12 may include the semiconductor package of example 1 and/or any other example disclosed herein, for which the first die may be one among a central processing unit, a graphic processing unit and a system-on-chip.

Example 13 may include the semiconductor package of example 1 and/or any other example disclosed herein, for which the first stacked device may be a memory device.

Example 14 may include the semiconductor package of example 1 and/or any other example disclosed herein, for which the second stacked device may be a memory device.

Example 15 provides a method of manufacturing a semiconductor package, the method including forming a silicon die on a carrier, forming a first mold layer on the carrier at a periphery of the silicon die, forming one or more first mold openings in the first mold layer, forming a conductive layer on the first mold layer and in the one or more first mold openings, and forming one or more conductive corridors in the first mold layer, and one or more conductive planes on the first mold layer by removing one or more portions of the conductive layer. The method further includes forming a final mold layer by depositing a second mold layer on the first mold layer and the one or more conductive planes, forming one or more second mold openings in the final mold layer, forming one or more conductive vias in the one or more second mold openings, and attaching one or more first stacked devices and one or more second stacked devices respectively to opposite surfaces of the silicon die and the one or more conductive vias.

Example 16 may include the method of example 15 and/or any other example disclosed herein, further including attaching, to a package substrate, the one or more first stacked devices and the one or more second stacked devices respectively attached to the opposite surfaces of the silicon die and the one or more conductive vias.

Example 17 may include the method of example 16 and/or any other example disclosed herein, further including forming an underfill layer between the silicon die and the package substrate, between the silicon die and the one or more first stacked devices, between the final mold layer and the one or more first stacked devices, and between the final mold layer and the package substrate.

Example 18 may include the method of example 17 and/or any other example disclosed herein, further including forming solder balls on contact pads of the package substrate.

Example 19 provides a computing device including a semiconductor package including a silicon die including a first die surface coupled to a package substrate, a second die surface opposite to the first die surface, and at least one die sidewall orthogonal to the first die surface and the second die surface, and a mold layer including a first mold surface, a second mold surface opposite to the first mold surface, and at least one mold sidewall orthogonal to the first mold surface and the second mold surface, the at least one mold sidewall being disposed along the at least one die sidewall, and the mold layer further including a power conductive corridor extending from the first mold surface and coupled to the package substrate through the first mold surface. The semiconductor package further includes a first stacked device coupled to the first die surface and to the power conductive corridor through the first mold surface, and a second stacked device coupled to the second die surface and to the power conductive corridor through the second mold surface.

Example 20 may include the computing device of example 19 and/or any other example disclosed herein, for which the mold layer may further include a power conductive plane extending from the power conductive corridor in parallel to the first mold surface and the second mold surface, a first power conductive via extending from the power conductive plane through the first mold surface, and coupled to the first stacked device, and a second power conductive via extending from the power conductive plane through the second mold surface, and coupled to the second stacked device. The power conductive corridor, the power conductive plane, the first power conductive via and the second power conductive via may be connected to a power supply voltage.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The methods described herein may be performed and the various processing or computation units and the devices and computing entities described herein may be implemented by one or more circuits. In an embodiment, a "circuit" may be understood as any kind of a logic implementing entity, which may be hardware, software, firmware, or any combination thereof. Thus, in an embodiment, a "circuit" may be a hard-wired logic circuit or a programmable logic circuit such as a programmable processor, e.g., a microprocessor. A "circuit" may also be software being implemented or executed by a processor, e.g., any kind of computer program, e.g., a computer program using a virtual machine code. Any other kind of implementation of the respective functions that are described herein may also be understood as a "circuit" in accordance with an alternative embodiment.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
a silicon die comprising a first die surface coupled to a package substrate, a second die surface opposite to the first die surface, and at least one die sidewall orthogonal to the first die surface and the second die surface;
a mold layer comprising a first mold surface, a second mold surface opposite to the first mold surface, and at least one mold sidewall orthogonal to the first mold surface and the second mold surface, the at least one mold sidewall being disposed along the at least one die sidewall, and the mold layer further comprising a power conductive corridor extending from the first mold surface and coupled to the package substrate through the first mold surface;
a first stacked device coupled to the first die surface and to the power conductive corridor through the first mold surface; and
a second stacked device coupled to the second die surface and to the power conductive corridor through the second mold surface.

2. The semiconductor package of claim 1, wherein the mold layer further comprises a power conductive plane extending from the power conductive corridor in parallel to the first mold surface and the second mold surface.

3. The semiconductor package of claim 2, wherein the mold layer further comprises:
a first power conductive via extending from the power conductive plane through the first mold surface, and coupled to the first stacked device; and
a second power conductive via extending from the power conductive plane through the second mold surface, and coupled to the second stacked device.

4. The semiconductor package of claim 3, wherein the second power conductive via is integrally formed with the first power conductive via.

5. The semiconductor package of claim 3, wherein the second power conductive via is horizontally offset from the first power conductive via.

6. The semiconductor package of claim 3, wherein the power conductive corridor, the power conductive plane, the first power conductive via and the second power conductive via are connected to a power supply voltage.

7. The semiconductor package of claim 3, wherein the mold layer further comprises:
a ground conductive corridor extending from the first mold surface and coupled to the package substrate through the first mold surface;

a ground conductive plane extending from the ground conductive corridor in parallel to the first mold surface and the second mold surface; and
a ground conductive via extending from the ground conductive plane through the first mold surface and the second mold surface, and coupled to the first stacked device and the second stacked device,
wherein the ground conductive corridor, the ground conductive plane and the ground conductive via are connected to a ground reference voltage.

8. The semiconductor package of claim 7, wherein the ground conductive plane is disposed adjacent the power conductive plane.

9. The semiconductor package of claim 8, wherein the ground conductive plane is coupled to the power conductive plane through one or more passive components.

10. The semiconductor package of claim 9, wherein each of the one or more passive components is one among a capacitor, a voltage regulator and an inductor.

11. The semiconductor package of claim 3, further comprising:
a first redistribution layer disposed on the first die surface and the first mold surface; and
a second redistribution layer disposed on the second die surface and the second mold surface,
wherein the first stacked device is coupled to the silicon die and the first power conductive via through the first redistribution layer, and
the second stacked device is coupled to the silicon die and the second power conductive via through the second redistribution layer.

12. The semiconductor package of claim 1, wherein the silicon die is a central processing unit, a graphic processing unit, or a system-on-chip.

13. The semiconductor package of claim 1, wherein the first stacked device is a memory device.

14. The semiconductor package of claim 1, wherein the second stacked device is a memory device.

15. A computing device comprising:
a semiconductor package comprising:
a silicon die comprising a first die surface coupled to a package substrate, a second die surface opposite to the first die surface, and at least one die sidewall orthogonal to the first die surface and the second die surface;
a mold layer comprising a first mold surface, a second mold surface opposite to the first mold surface, and at least one mold sidewall orthogonal to the first mold surface and the second mold surface, the at least one mold sidewall being disposed along the at least one die sidewall, and the mold layer further comprising a power conductive corridor extending from the first mold surface and coupled to the package substrate through the first mold surface;
a first stacked device coupled to the first die surface and to the power conductive corridor through the first mold surface; and
a second stacked device coupled to the second die surface and to the power conductive corridor through the second mold surface.

16. The computing device of claim 15, wherein the mold layer further comprises:
a power conductive plane extending from the power conductive corridor in parallel to the first mold surface and the second mold surface;

a first power conductive via extending from the power conductive plane through the first mold surface, and coupled to the first stacked device; and a second power conductive via extending from the power conductive plane through the second mold surface, and coupled to the second stacked device, wherein the power conductive corridor, the power conductive plane, the first power conductive via and the second power conductive via are connected to a power supply voltage.

* * * * *